United States Patent [19]
Hsu

[11] Patent Number: 5,972,755
[45] Date of Patent: Oct. 26, 1999

[54] ELECTROSTATIC PROTECTION COMPONENT AND MANUFACTURING METHOD

[75] Inventor: Chen-Chung Hsu, Taichung, Taiwan

[73] Assignee: United Microelectronics Corp., Hsinchu, Taiwan

[21] Appl. No.: 09/281,001

[22] Filed: Mar. 30, 1999

Related U.S. Application Data

[62] Division of application No. 08/932,540, Sep. 17, 1997.

[30] Foreign Application Priority Data

May 21, 1997 [TW] Taiwan ................... 86106775

[51] Int. Cl.$^6$ .............................................. H01L 21/8234
[52] U.S. Cl. ............................................ 438/275; 438/281
[58] Field of Search ..................................... 438/275, 281, 438/305, 592, 301, 586, 631, 394; 257/319, 522

[56] References Cited

U.S. PATENT DOCUMENTS

| | | | |
|---|---|---|---|
| 4,561,169 | 12/1985 | Miyazaki et al. ................. | 438/301 |
| 4,957,877 | 9/1990 | Tam et al. ........................ | 437/43 |
| 4,997,777 | 3/1991 | Boivin ............................. | 437/38 |
| 5,281,549 | 1/1994 | Fazan et al. ..................... | 437/52 |
| 5,534,457 | 7/1996 | Tseng et al. ..................... | 437/52 |
| 5,776,806 | 7/1998 | Dennison et al. ................ | 438/275 |
| 5,817,563 | 10/1998 | Lim ................................. | 438/305 |
| 5,886,379 | 3/1999 | Jeong .............................. | 257/319 |
| 5,888,863 | 3/1999 | Tseng .............................. | 438/396 |

*Primary Examiner*—John F. Niebling
*Assistant Examiner*—Walter L. Lindsay, Jr.
*Attorney, Agent, or Firm*—Finnegan, Henderson, Farabow, Garrett & Dunner, L.L.P.

[57] ABSTRACT

An electrostatic protection component and a method for forming the same. The method includes forming a gate consisting of a gate oxide layer and a conducting layer above a semiconductor substrate. Spacers are formed on the peripheral sidewalls of the gate. First heavily doped regions are formed in the semiconductor substrate. A metallic layer is formed covering the semiconductor substrate followed by a heating process. First metal silicide layers are formed above the gate while second metal silicide layers are formed above the first heavily doped regions. A photoresist layer is coated above the semiconductor substrate, exposing the first metal silicide layer and part of the second metal silicide layer adjacent to each side of the gate. An etching operation removes the spacers and part of the conducting layer to expose part of the gate oxide layer surface, so that the gate is ultimately transformed into an I-shaped structure having an upper first metal silicide layer, a middle conducting layer and a lower gate oxide layer. An insulating layer is formed above the semiconductor substrate. Contact window openings are formed in the insulating layer exposing the second metal silicide layer.

6 Claims, 4 Drawing Sheets ium layer is removed by etching.
ELECTROSTATIC PROTECTION COMPONENT AND MANUFACTURING METHOD This is a division of application Ser. No. 08/932,540 filed Sep. 17, 1997, all of which are incorporated herein by reference.

BACKGROUND OF THE INVENTION

1. Field of Invention

The present invention relates to a type of electrostatic protection component and its manufacturing method, and more particularly to an electrostatic protection component suitable for use in a self-aligned silicide process, and associated manufacturing method.

2. Description of Related Art

FIGS. 1A through 1F are a series of cross-sectional views showing the progression of steps in the manufacturing of a conventional electrostatic protection component.

First, referring to FIG. 1A, a first gate terminal 11 and a second gate terminal 12 are formed above a semiconductor substrate 10. After that, using the first gate terminal 11 and the second gate terminal 12 as masks, an ion implantation operation is carried out, for example, implanting N-type ions, to form first lightly doped regions 13 in the semiconductor substrate 10 on each side of the first gate terminal 11 as well as first lightly doped regions 14 in the semiconductor substrate 10 on each side of the second gate terminal 12.

Thereafter, referring to FIG. 1B, a deposition method is used to form an oxide layer 15, preferably a borophosphosilicate glass (BPSG) layer, covering the semiconductor substrate 10.

Then, referring to FIG. 1C, the oxide layer 15 is etched to form first spacers 16 on the sidewalls of the first gate terminal 11 and second spacers 17 on the sidewalls of the second gate terminal 12. Following that, using the first gate terminal 11, the first spacers 16, the second gate terminal 12 and the second spacers 17 as masks, another ion implantation operation is performed, again implanting N-type ions into the semiconductor substrate 10, to form first heavily doped regions 18 and 19 on each side of the first gate terminal 11 and the second gate terminal 12, respectively.

Next, referring to FIG. 1D, a metallic layer, for example, a titanium metal layer, is sputtered onto the surface of the semiconductor substrate 10, and then a rapid thermal processing (RTP) is applied to let the titanium metal react with the silicon above various surfaces of the semiconductor substrate 10 to form metal silicide layers 110, preferably titanium silicide layers, above the first gate terminal 11, the second gate terminal 12, and the first heavily doped regions 18 and 19. Thereafter, the residual unreacted metallic titanium layer is removed by etching.

Subsequently, referring to FIG. 1E, a photoresist layer covering the metal silicide layers 110 is formed above the first gate terminal 11 and the first heavily doped regions 18 followed by etching to remove the second spacers 17 from the second gate terminal 12. Thereafter, an ion implantation operation is performed by implanting N-type ions into the semiconductor substrate 10 to form second heavily doped regions 111 in place of the original second lightly doped regions 14 near the second gate terminal 12. The width of the second heavily doped regions 111 is about 0.1 μm. After that, the metal silicide layer 110 above the first heavily doped regions 19 are removed by etching to expose the first heavily doped regions 19. The reason for establishing the second heavily doped regions 111 is to shorten the channel length below the second gate terminal 12 such that electrostatic discharging current can be more easily absorbed, and the reason for removing the metal silicide layer 110 above the first heavily doped regions 19 is to increase electrical resistance there so that a higher voltage can be reached when there is a sudden electrostatic discharge from the component, and therefore be more capable of withstanding damages resulting from the passing of a transient heavy current.

Finally, referring to FIG. 1F, an insulating layer 112, preferably a borophosphosilicate glass layer, is formed covering the semiconductor substrate 10. Then, a number of contact window openings 113 are formed by etching the insulating layer 112 and exposing the first heavily doped regions 18 and 19, for example, by forming contact windows 113a and 113b, one on each side of the second gate terminal 12, thus completing the manufacturing steps required for forming a conventional electrostatic protection component.

However, when the component dimensions are further reduced, the original designed reliability of such a conventional electrostatic protection component is difficult to maintain. For example, the distance between the second gate terminal 12 and the contact window opening 113a is preferably maintained at between 3 μm to 4 μm. If this distance is reduced as the size of the component is reduced, or for any other reason, current leakage can occur more easily, thereby losing part of the electrostatic protection function. In addition, the aforementioned method for manufacturing the electrostatic protection component is rather complicated and involves a lot of steps. Hence, production cost as well as production time is increased.

SUMMARY OF THE INVENTION

The present invention provides a type of electrostatic protection component and associated manufacturing method that can increase the distance between the gate terminal and the adjacent contact window opening when the dimensions of the component are reduced, and therefore maintain good reliability. Moreover, the manufacturing steps are rather simple, resulting in the elimination of a sidewall etching step and a photoresist overlaying step, hence reducing production time and production cost.

In accordance with the purposes of the invention, as embodied and broadly described herein, the invention comprises a method for manufacturing electrostatic protection components. The method includes the following steps.

A gate terminal is formed consisting of a gate oxide layer and a conducting layer above a semiconductor substrate. Spacers are formed on the peripheral sidewalls of the gate, and then first heavily doped regions are formed in the semiconductor substrate. A metallic layer is formed covering the semiconductor substrate followed by a heating process, forming first metal silicide layers above the gate terminal and forming second metal silicide layers above the first heavily doped regions. A photoresist layer is coated over the semiconductor substrate, exposing the first metal silicide layer and part of the second metal silicide layer adjacent to each side of the gate. An etching operation is performed to remove the spacers and part of the conducting layer so as to expose part of the gate oxide layer surface, so that the gate is ultimately transformed into an I-shaped structure, consisting of an upper first metal silicide layer, a middle conducting layer and a lower gate oxide layer. An insulating layer is formed above the semiconductor substrate, and then contact window openings are formed in the insulating layer exposing the second metal silicide layer.

Additional advantages of the invention will be set forth in the description which follows, and in part will be understood from the description or may be learned by practice of the invention.

BRIEF DESCRIPTION OF THE DRAWINGS

The accompanying drawings, which are incorporated in and constitute a part of the specification, illustrate a preferred embodiment of the invention. Together with the general description given above and the detailed description of the preferred embodiments given below, the drawings serve to explain the principles of the invention.

DESCRIPTION OF THE PREFERRED EMBODIMENTS

Reference will now be made in detail to the present preferred embodiments of the invention as broadly illustrated in the accompanying drawings.

An important characteristic of the electrostatic protection component provided by the present invention is the special three-layered I-shaped gate structure consisting of an upper metal silicide layer, a middle polysilicon layer and a lower gate oxide layer. A width of the middle polysilicon layer can be very narrow and less than the widths of the upper metal silicide layer and lower gate oxide layer, so as to increase the isolating distance between the gate and its nearest contact window opening, with the result that when component dimensions are reduced, good electrostatic discharge protection can still be maintained.

FIGS. 2A through 2F are a series of cross-sectional views showing the progression of manufacturing steps in the production of an electrostatic protection component according to one preferred embodiment of the invention.

Figure 1A:
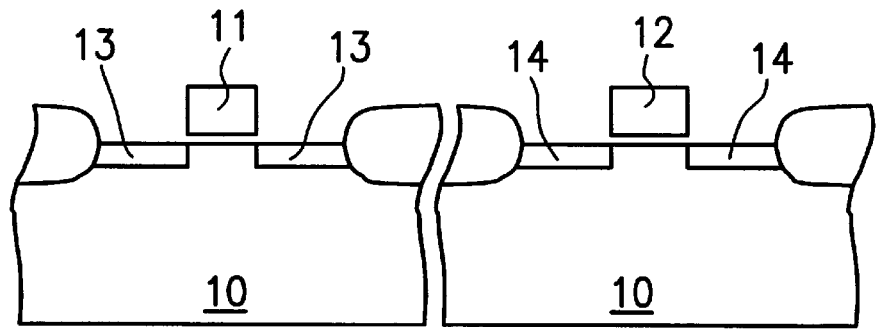
FIGS. 1A through 1F are a series of cross-sectional views showing the progression of manufacturing steps the production of an electrostatic protection component by a conventional method.
Figure 1B:
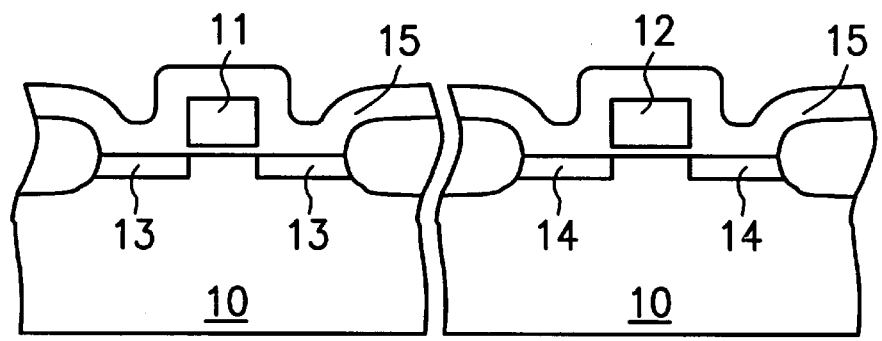
Figure 1C:
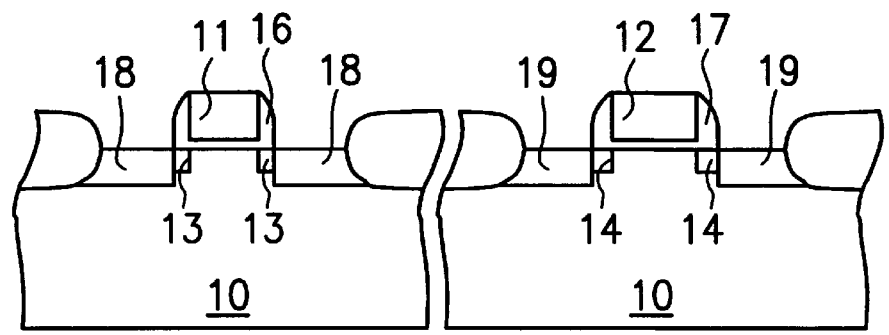
Figure 1D:
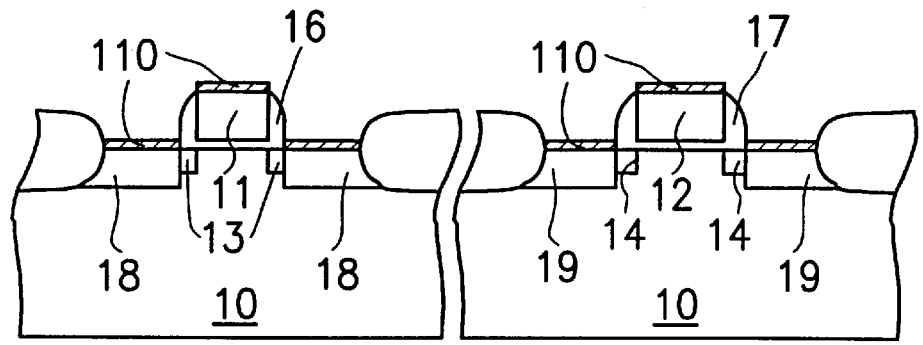
Figure 1E:
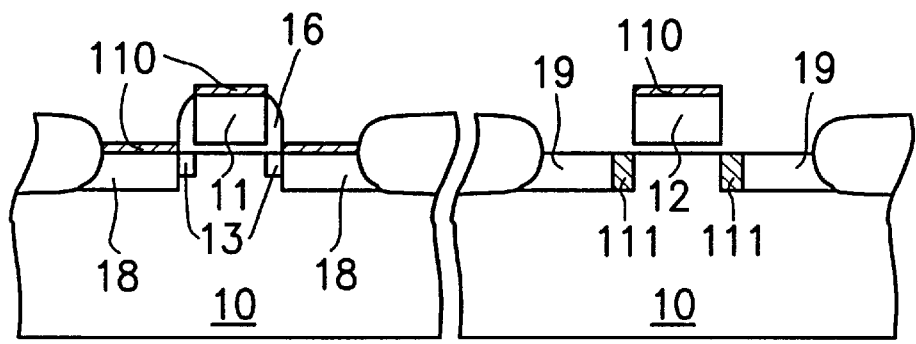
Figure 1F:
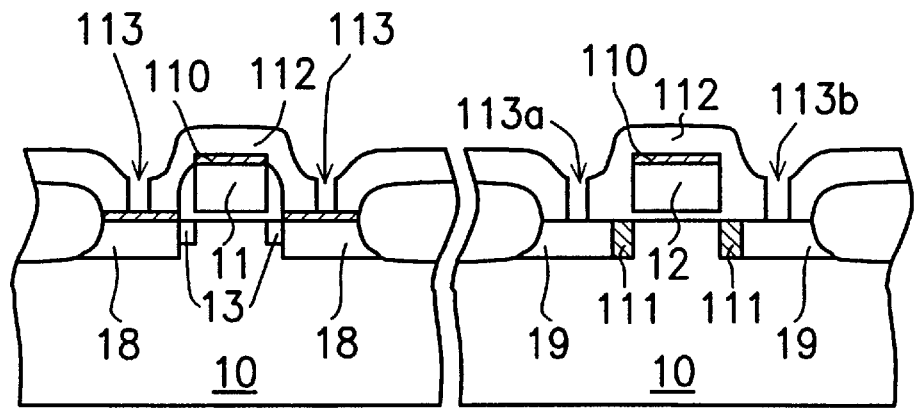
Figure 2A:
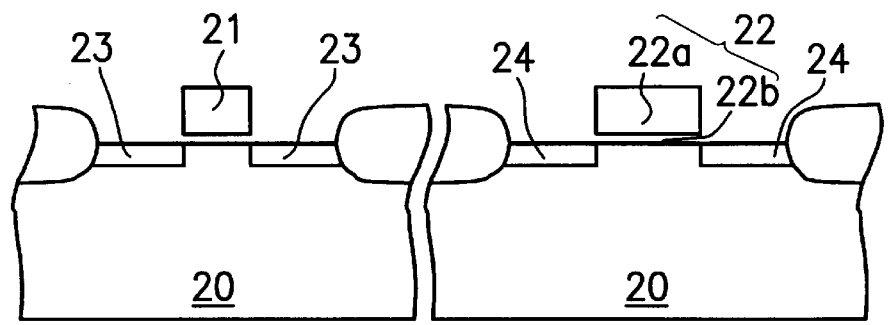
FIGS. 2A through 2F are a series of cross-sectional views showing the progression of manufacturing steps in the production of an electrostatic protection component according to one preferred embodiment of the invention.

First, referring to FIG. 2A, a semiconductor substrate 20 is provided. Then, a first gate terminal 21 and a second gate terminal 22 are formed simultaneously above the semiconductor substrate 20. The first gate terminal 21 is formed inside an internal circuit area acting as a gate structure for a memory or a logic component. The second gate terminal 22 is formed outside and on a periphery of the internal circuit area acting as a gate structure for the electrostatic protection component. The second gate terminal 22 consists of a gate oxide layer 22b and a conducting layer 22a, with the conducting layer 22a preferably being a polysilicon layer. The width of the second gate terminal 22 preferably is about 5 $\mu$m to 7 $\mu$m.

Thereafter, an ion implantation operation is performed using the first gate terminal 21 and the second gate terminal 22 as masks to form a plurality of first lightly doped regions 23 and 24 in the semiconductor substrate 20. The first lightly doped regions 23 preferably are located on each side of the first gate terminal 21 while the first lightly doped regions 24 preferably are located on each side of the second gate terminal 22.

Figure 2B:
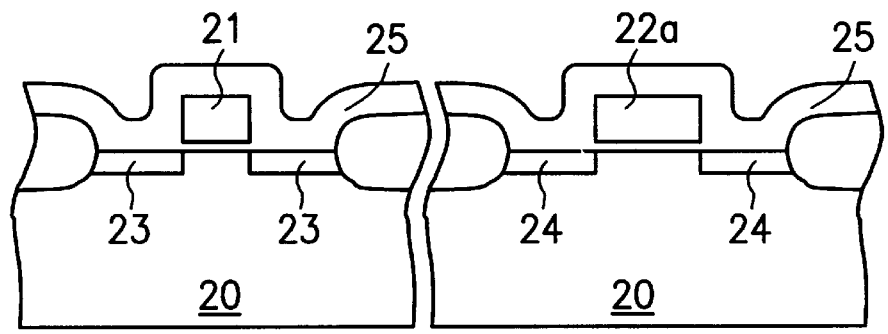
Figure 2C:
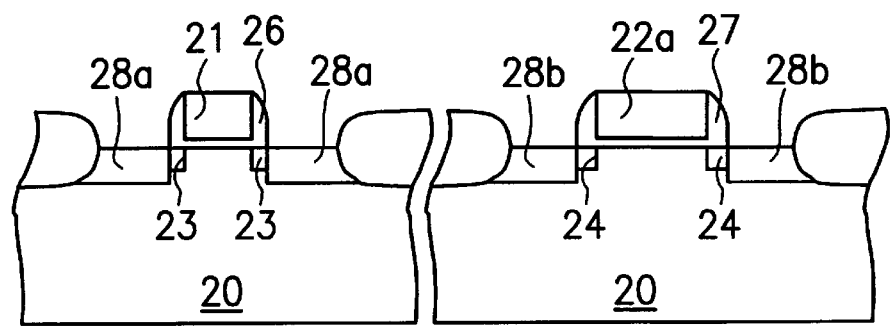

Referring next to FIG. 2B, an insulating layer 25 is deposited over the semiconductor substrate 20. Subsequently, referring to FIG. 2C, the insulating layer 25 is etched forming spacers 26 and spacers 27 on the peripheral sidewalls of the first gate terminal 21 and the second gate terminal 22, respectively. Following that, another ion implantation operation is performed using the spacers 26 and spacers 27 as masks, to form a plurality of first heavily doped regions 28a and 28b in the semiconductor substrate 20. Part of the first heavily doped region 28a overlaps with part of the first lightly doped region 23, while part of the first heavily doped region 28b overlaps with part of the first lightly doped region 24.

Figure 2D:
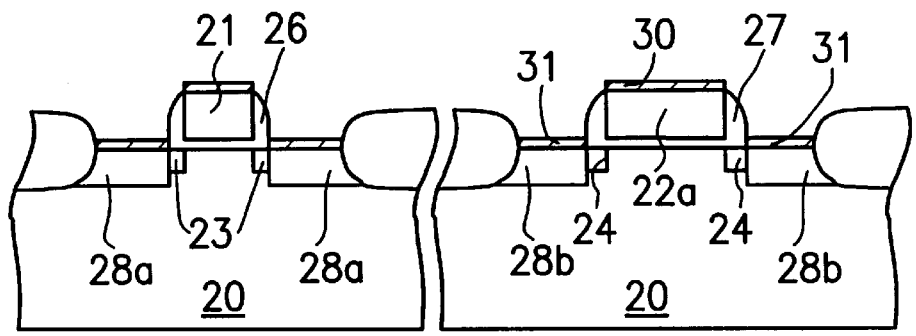

Referring next to FIG. 2D, a metallic layer, preferably a titanium layer, is formed covering the semiconductor substrate 20. Then, heating is carried out to let the metallic layer react with the silicon above the semiconductor substrate 20 forming a plurality of metal silicide layers above the semiconductor substrate 20, for example, first metal silicide layers 30 above the second gate terminal 22, and second metal silicide layers 31 above the first heavily doped regions 28b. A width of the first metal silicide layer 30 and a width of the conducting layer 22a are about the same at this point, for example, preferably between 5 $\mu$m to 7 $\mu$m. Lastly, the unreacted metallic layer is removed.

Figure 2E:
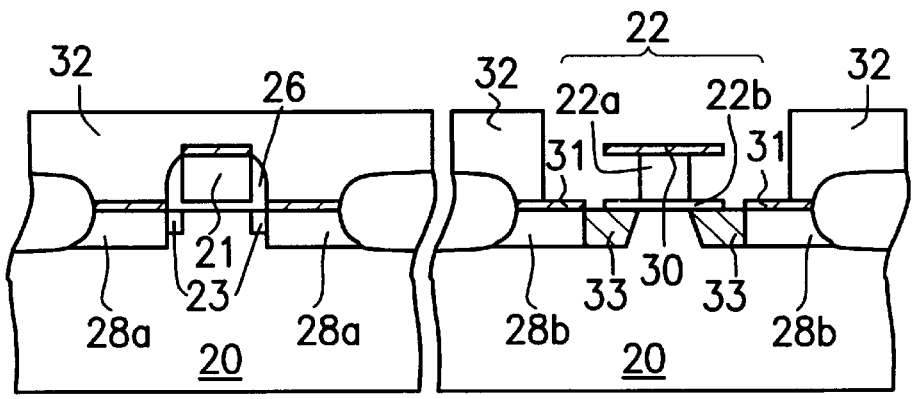

Referring next to FIG. 2E, a photoresist layer 32 is coated over the semiconductor substrate 20, exposing the first metal silicide layer 30 and part of the second metal silicide layers 31 on each side of the second gate terminal 22. Later, using the photoresist layer 32 as a mask, part of the conducting layer 22a is etched away, preferably using an isotropic wet etching method, exposing part of the surface of the gate oxide layer 22b. The etching time is monitored so that the ultimate width of the conducting layer 22a is reduced to about 1 $\mu$m. Thus, an I-shaped second gate structure 22 is formed, with an upper first metal silicide layer 30, a middle conducting layer 22a, and a lower gate oxide layer 22b, as shown in FIGS. 2E and 2F.

Thereafter, N-type ions are implanted into the semiconductor substrate 20 forming a plurality of second heavily doped regions 33 between the conducting layer 22a and the first heavily doped regions 28b. In accordance with the invention, it has been found advantageous to perform this step using a tilt angle implantation method. A large tilt angle was found to be most advantageous, preferably between 45 and 60. Subsequently, the photoresist layer 32 is removed. The width of each second heavily doped region 33 is about 2.1 $\mu$m, which is considerably wider than the conventional width of 0.1 $\mu$m, and therefore the component is able to improve the electrostatic discharge protection capability.

Figure 2F:
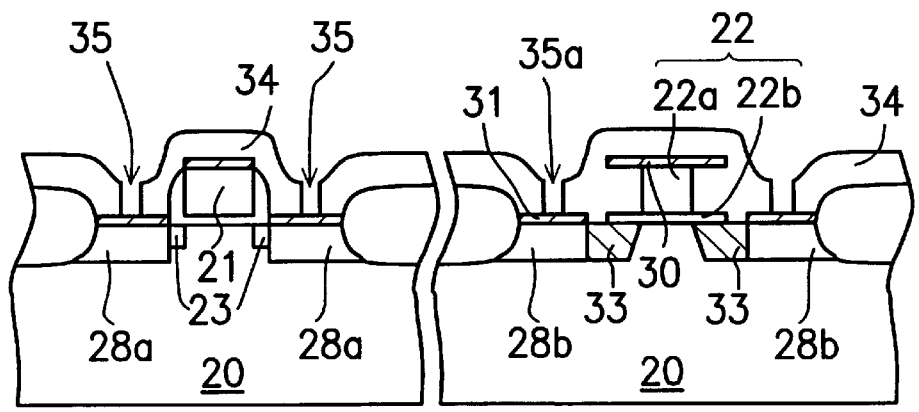

Finally, referring to FIG. 2F, an insulating layer 34 is formed above the semiconductor substrate 20, and then a plurality of contact window openings 35 are formed in the insulating layer 34, for example, contact window 35a exposing the second metal silicide layer 31. As a result, a distance from the contact window opening 35a to the conducting layer 22a is increased compared to the contact window opening in the conventional device, and has a distance at least of between 3 $\mu$m to 4 $\mu$m.

The present invention, formed by the process described above, includes the following advantages:

(1) There is a large increase in the participating conducting area of the electrostatic discharge protection component. For example, the width of the second heavily doped region 33 is increased from the conventional 0.1 $\mu$m to at least 0.1 $\mu$m+(2 to 3)$\mu$m, thereby strengthening the electrostatic discharge protection capability.

(2) Even when the component dimensions are reduced, due to the I-shape of second gate terminal 22, a distance of about 3 μm to 4 μm is still maintained between the second gate terminal 22 and the contact window opening 35a for the electrostatic protection component produced by the present invention. Hence, besides satisfying the design rule, component reliability is also conserved.

(3) The manufacturing steps required to produce the electrostatic protection component according to the invention are relatively simple. With the elimination of one photoresist coating step and one metal silicide etch removal step, both production cost and production time are reduced.

While the invention has been described by way of example and in terms of the preferred embodiments, it is to be understood that the invention is not limited to the disclosed embodiments and process steps. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for forming an electrostatic protection component on a semiconductor substrate comprising the steps of:

forming a gate above the semiconductor substrate, the gate comprising an oxide layer and a conducting layer;

forming a lightly doped region on a side of the gate in the semiconductor substrate;

forming a spacer on a peripheral sidewall of the gate;

forming a first heavily doped region in the semiconductor substrate, with the first heavily doped region overlapping a portion of the lightly doped region;

forming a first metal silicide layer above the gate and forming a second metal silicide layer above the first heavily doped region;

coating a photoresist layer over the semiconductor substrate, and defining a pattern so as to expose the first metal silicide layer and a portion of the second metal silicide layer;

removing the spacers and part of the conducting layer to expose part of the gate oxide layer surface, thereby transforming the gate into an I-shaped structure having an upper metal silicide layer, a middle conducting layer and a lower gate oxide layer;

forming a second heavily doped region between the conducting layer and the first heavily doped region; and forming an insulating layer above the semiconductor substrate, having a contact window opening in the insulating layer exposing the second metal silicide layer.

2. A method according to claim 1, wherein a distance between the conducting layer and the nearest contact window opening is between 3 μm to 4 μm.

3. A method according to claim 1, wherein a width of the first metal silicide layer is about 5 μm to 7 μm.

4. A method according to claim 1, wherein the step of forming a second heavily doped region includes using an isotropic wet etching method.

5. A method according to claim 1, wherein a width of the conducting layer is about 1 μm.

6. A method according to claim 1, wherein the step of forming the second heavily doped region includes an ion implantation method using a tilt angle set between 45 to 60.

* * * * *